(12) United States Patent
Hayashi

(10) Patent No.: US 9,281,460 B2
(45) Date of Patent: Mar. 8, 2016

(54) LIGHT EMITTING DEVICE PACKAGE AND LIGHT EMITTING DEVICE HAVING LEAD-FRAMES

(71) Applicant: NICHIA CORPORATION, Anan-shi (JP)

(72) Inventor: Hideki Hayashi, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 14/064,200

(22) Filed: Oct. 28, 2013

(65) Prior Publication Data

US 2014/0117403 A1    May 1, 2014

(30) Foreign Application Priority Data

Oct. 31, 2012    (JP) .................................. 2012-241155

(51) Int. Cl.
*H01L 27/15*    (2006.01)
*H01L 29/267*    (2006.01)
(Continued)

(52) U.S. Cl.
CPC ............. *H01L 33/62* (2013.01); *H01L 25/0753* (2013.01); *H01L 2224/32245* (2013.01);
(Continued)

(58) Field of Classification Search
CPC .................. H01L 2924/00; H01L 2924/00014; H01L 2924/171; H01L 2924/1715; H01L 2924/81; H01L 2224/32245; H01L 2224/73265; H01L 2224/45144; H01L 2224/48091; H01L 2224/48247; H01L 2224/48257; H01L 25/0753; H01L 2933/0033; H01L 33/62; H01L 33/52; H01L 31/00; H01L 31/0203; H01L 31/0232; H01L 21/4821; H01L 21/67144; H01L 23/495; H01L 23/49537; H01L 23/49541; H01L 23/498; H01L 23/49838; H01L 23/49861

USPC ......... 257/79, 81, 88, 99, 100, 431, 433, 666, 257/678, 690, 692, 734, 773, 775, 787
See application file for complete search history.

(56) References Cited

U.S. PATENT DOCUMENTS 5,874,748 A      2/1999  Osawa
7,282,785 B2 *  10/2007  Yoshida ........................ 257/666
(Continued)

FOREIGN PATENT DOCUMENTS

JP    09-321344    12/1997
JP    2003-110145    4/2003
(Continued)

OTHER PUBLICATIONS

Extended European Search Report for corresponding EP Application No. 13199676.1-1551, Mar. 13, 2014.
(Continued)

*Primary Examiner* — Teresa M Arroyo
(74) *Attorney, Agent, or Firm* — Mori & Ward, LLP

(57) ABSTRACT

The light emitting device package has a lengthwise direction as viewed from above and a lateral or widthwise direction perpendicular to the lengthwise direction, and is provided with two lead-frames lined-up in the lengthwise direction and molded resin formed as a single unit with the two lead-frames. The package is characterized in that each of the two lead-frames has a first thin region that is thinned by establishing a recess in the lower surface and/or the upper surface of the lead-frame, and that recess is covered with molded resin. Further, each lead-frame has an extension that narrows as it extends towards the opposite lead-frame. Both extensions are entirely within first thin regions, and as viewed from above, at least parts of the opposing extensions are positioned opposite each other in the lateral direction.

15 Claims, 2 Drawing Sheets

(51) Int. Cl.
*H01L 33/00* (2010.01)
*H01L 31/0203* (2014.01)
*H01L 23/48* (2006.01)
*H01L 23/52* (2006.01)
*H01L 33/62* (2010.01)
*H01L 25/075* (2006.01)

(52) U.S. Cl.
CPC ........... *H01L2224/45144* (2013.01); *H01L 2224/48091* (2013.01); *H01L 2224/48247* (2013.01); *H01L 2224/48257* (2013.01); *H01L 2224/73265* (2013.01); *H01L 2924/171* (2013.01); *H01L 2924/1715* (2013.01); *H01L 2924/181* (2013.01); *H01L 2933/0033* (2013.01)

(56) References Cited

U.S. PATENT DOCUMENTS

| | | | |
|---|---|---|---|
| 7,675,145 B2* | 3/2010 | Wong et al. | 257/676 |
| 2003/0075724 A1* | 4/2003 | Wang et al. | 257/99 |
| 2004/0056265 A1 | 3/2004 | Arndt et al. | |
| 2005/0280017 A1 | 12/2005 | Oshio et al. | |
| 2006/0170083 A1* | 8/2006 | Kim et al. | 257/666 |
| 2008/0042151 A1 | 2/2008 | Oh et al. | |
| 2008/0151557 A1 | 6/2008 | Su et al. | |
| 2008/0210964 A1 | 9/2008 | Tomioka | |
| 2010/0314654 A1 | 12/2010 | Hayashi | |
| 2011/0186875 A1 | 8/2011 | Egoshi et al. | |
| 2011/0215349 A1 | 9/2011 | An et al. | |
| 2011/0220927 A1 | 9/2011 | Min | |
| 2012/0025260 A1* | 2/2012 | Oonakahara et al. | 257/99 |
| 2012/0112227 A1 | 5/2012 | Toyama | |
| 2013/0087817 A1 | 4/2013 | An et al. | |
| 2013/0127034 A1 | 5/2013 | Hasegawa et al. | |
| 2013/0264604 A1* | 10/2013 | Hayashi | H01L 33/54 257/99 |
| 2013/0299854 A1* | 11/2013 | Lee et al. | 257/88 |
| 2014/0054629 A1* | 2/2014 | Kim | 257/91 |
| 2014/0183574 A1* | 7/2014 | Nakabayashi et al. | 257/88 |
| 2014/0239321 A1* | 8/2014 | Lu et al. | 257/89 |
| 2014/0239332 A1* | 8/2014 | Iwakura | H01L 33/50 257/98 |
| 2014/0252574 A1* | 9/2014 | Nakabayashi | H01L 23/49537 257/666 |
| 2014/0264426 A1* | 9/2014 | Yamashita | H01L 23/495 257/99 |
| 2015/0001559 A1* | 1/2015 | Sasaoka et al. | 257/88 |
| 2015/0021640 A1* | 1/2015 | Oka | H01L 24/48 257/98 |
| 2015/0162509 A1* | 6/2015 | Kuramoto | H01L 33/50 257/98 |

FOREIGN PATENT DOCUMENTS

| | | |
|---|---|---|
| JP | 3130684 | 4/2007 |
| JP | 3140772 U | 4/2008 |
| JP | 2011-134902 | 7/2011 |
| JP | 2011-159837 | 8/2011 |
| JP | 2011-176264 | 9/2011 |
| JP | 2011-249807 | 12/2011 |
| JP | 2011-254080 | 12/2011 |
| JP | 2012-151436 | 8/2012 |
| JP | 2012-182485 | 9/2012 |
| JP | 2005-353914 | 10/2012 |
| JP | 2012-190970 | 10/2012 |
| JP | 2012-195430 | 10/2012 |
| JP | 2012-209377 | 10/2012 |
| KR | 10-2012-0001189 | 1/2012 |
| KR | 10-1116951 | 3/2012 |
| WO | WO 02/17401 | 2/2002 |
| WO | WO 2008/081794 | 7/2008 |
| WO | WO 2008/156020 | 12/2008 |
| WO | WO 2012/014382 | 2/2012 |

OTHER PUBLICATIONS

Office Action with Form PTO-892 Notice of References Cited issued by the U.S. Patent and Trademark Office for the co-pending U.S. Appl. No. 14/141,429, Feb. 23, 2015.

Notice of Allowance issued by the U.S. Patent and Trademark Office for the U.S. Appl. No. 14/141,429, Jun. 3, 2015.

Notice of Allowance issued by the U.S. Patent and Trademark Office for the co-pending U.S. Appl. No. 14/141,429, Sep. 15, 2015.

Extended European Search Report for corresponding EP Application No. 14174566.1-1551, Nov. 6, 2014.

Requirement for Restriction/Election issued by the U.S. Patent and Trademark Office for the corresponding U.S. Appl. No. 14/315,332, May 7, 2015.

Notice of Allowance issued by the U.S. Patent and Trademark Office for the corresponding U.S. Appl. No. 14/315,332, Aug. 17, 2015.

Notice of Allowance issued by the U.S. Patent and Trademark Office for the co-pending U.S. Appl. No. 14/315,332, Dec. 9, 2015.

* cited by examiner

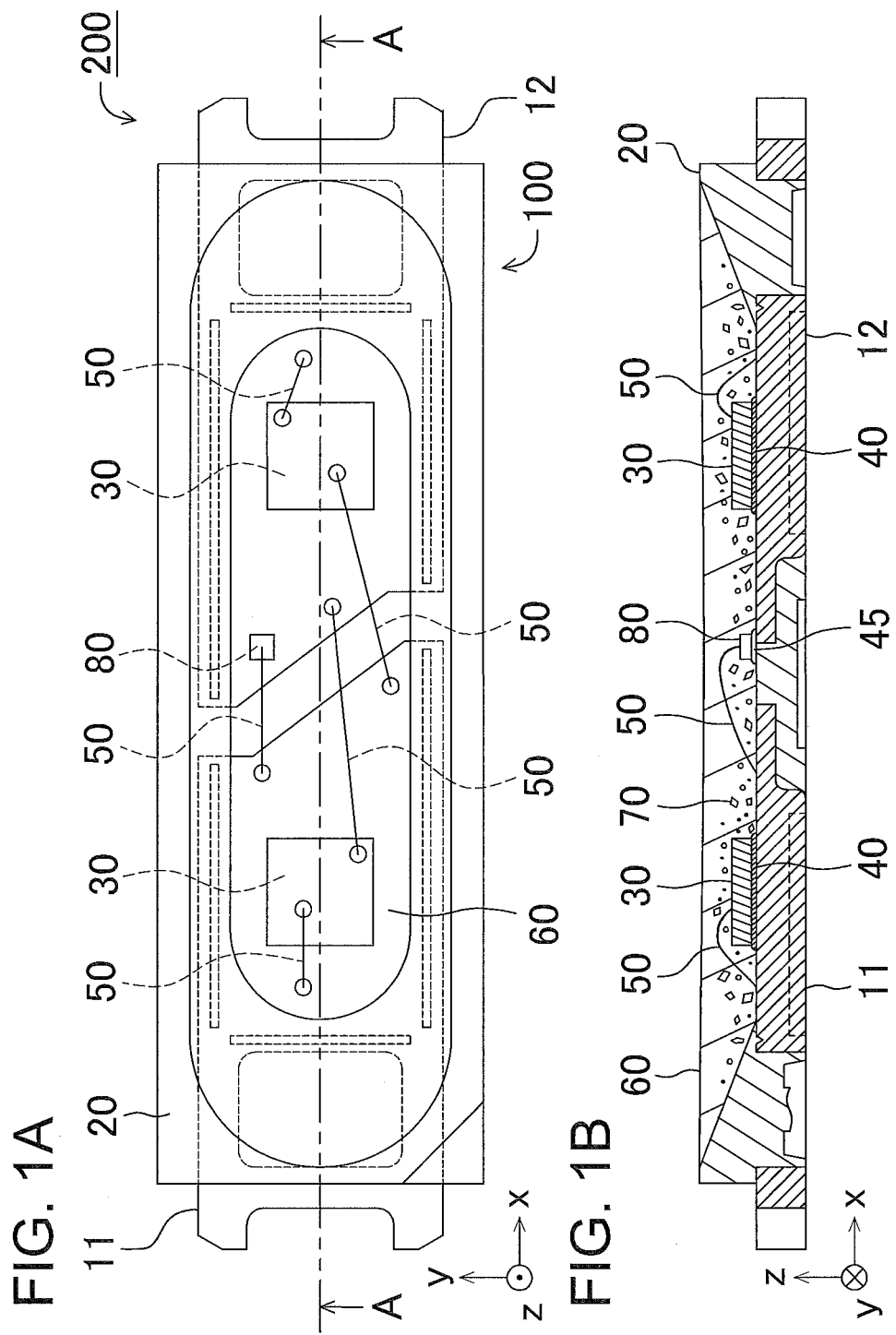

LIGHT EMITTING DEVICE PACKAGE AND LIGHT EMITTING DEVICE HAVING LEAD-FRAMES

CROSS-REFERENCE TO RELATED APPLICATIONS

The present application claims priority under 35 U.S.C. §119 to Japanese Patent Application No. 2012-241155, filed Oct. 31, 2012. The contents of this application are incorporated herein by reference in their entirety.

BACKGROUND OF THE INVENTION

1. Field of the Invention

The present invention relates to a light emitting device package (also referred to simply as the package) and to a light emitting device.

2. Description of the Related Art

As an example, Japanese Laid-Open Patent Publication 2011-134902 cites a light emitting diode (LED) surface-mount device (SMD) using a light emitting device package having two lead-frames molded as a single unit resin package with a cavity. The light emitting device is manufactured by mounting LED chips in the cavity and enclosing the device with encapsulating resin.

SUMMARY OF THE INVENTION

A light emitting device package of the present invention has a lengthwise direction (as viewed from above) and a lateral or widthwise direction perpendicular to the lengthwise direction, and is provided with two lead-frames lined-up in the lengthwise direction and molded resin formed as a single unit with the two lead-frames. The package comprises each of the two lead-frames has a first thin region that is thinned by establishing a recess in the lower surface and/or the upper surface of the lead-frame, and that recess is covered with molded resin. Further, each lead-frame has an extension that narrows as it extends towards the opposite lead-frame. Both extensions are entirely within first thin regions, and (as viewed from above) at least parts of the opposing extensions are positioned opposite each other in the lateral direction.

A light emitting device comprising: the light emitting device package; and a light emitting element mounted on the upper surface of at least one of the two lead-frames.

BRIEF DESCRIPTION OF THE DRAWINGS

FIG. 1A is an abbreviated top view (plan view) of a light emitting device for an embodiment;

FIG. 1B is an abbreviated cross-section view through line A-A in FIG. 1A;

DESCRIPTION OF THE EMBODIMENT(S)

Figure 2A:
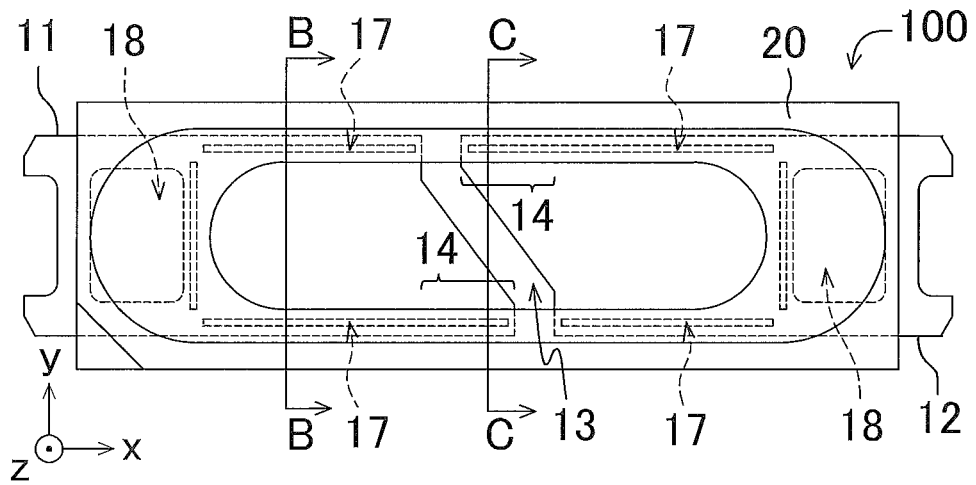
FIG. 2A is an abbreviated top view (plan view) of a light emitting device package for an embodiment.

The following describes embodiments and examples with reference to appropriate figures. However, the light emitting device package and light emitting device using that package described below are merely specific examples of the technology associated with the present embodiment, and unless otherwise noted, the present invention is not limited to the embodiments and examples described below. The details of one embodiment or example may also be applicable to other embodiments or examples. Further, properties such as size and positional relation of materials and components shown in the various figures may be exaggerated for purposes of descriptive clarity.

A light emitting device package has a lengthwise direction (as viewed from above) and a lateral or widthwise direction perpendicular to the lengthwise direction, and is provided with two lead-frames lined-up in the lengthwise direction and molded resin formed as a single unit with the two lead-frames. The package comprises each of the two lead-frames has a first thin region that is thinned by establishing a recess in the lower surface and/or the upper surface of the lead-frame, and that recess is covered with molded resin. Further, each lead-frame has an extension that narrows as it extends towards the opposite lead-frame. Both extensions are entirely within first thin regions, and (as viewed from above) at least parts of the opposing extensions are positioned opposite each other in the lateral direction.

The light emitting device package can be further configured as follows. The recess in each of the two lead-frames to form the first thin region can be established only on the lower surface of the lead-frame. The (centerline of the) gap region between lateral edge regions of the two lead-frames can be established approximately parallel to the lateral direction (as viewed from above). Each of the two lead-frames can have a recess established on the upper surface of the extension, and that recess can be embedded in molded resin. The extensions can be positioned approximately in the center of the light emitting device package. Each of the two lead-frames can have second thin regions (separated from the first thin region) that are thinned by establishing recesses in the lower surface at lateral edge regions of the lead-frame, and those recesses can be covered with molded resin. Each of the two lead-frames can have a through-hole established near the end of the lead-frame (in the lengthwise direction) opposite the extension, and that through-hole can be embedded in molded resin. The lowest surfaces of the two lead-frames along with the lowest surface of the molded resin can form the bottom surface of the light emitting device package.

The light emitting device is provided with any one of the light emitting device packages described above and a light emitting element mounted on the upper surface of at least one of the two lead-frames.

The light emitting device can be configured as follows. The light emitting device can be provided with wires that connect a light emitting element mounted on one of the two lead-frames with the upper surface of the extension of the opposite lead-frame. One light emitting element can be mounted on each of the two lead-frames. The extensions can be positioned approximately in the center of the light emitting device package, and the light emitting device can be provided with a protection device mounted on the upper surface of either one of the two lead-frame extensions.

The light emitting device package increases tolerance particularly to stress applied near the gap region between the two lead-frames, allows molded resin cracking and lead-frame delamination to be suppressed, and allows a high reliability package to be realized. As a result, this allows the manufacture of a light emitting device with high reliability. The above and further objects of the present embodiment as well as the features thereof will become more apparent from the following detailed description to be made in conjunction with the accompanying drawings.

First Embodiment

Figure 2B:
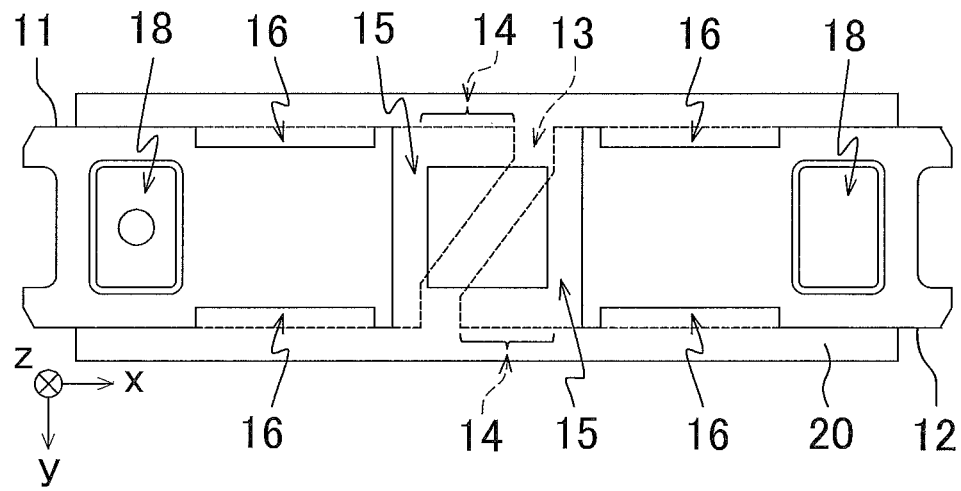
FIG. 2B is a bottom view of the light emitting device package in FIG. 2A.
Figure 2C:
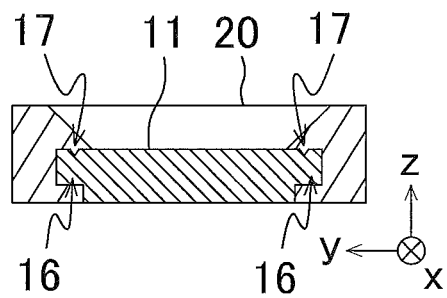
FIG. 2C is an enlarged abbreviated cross-section view through line B-B in FIG. 2A.
Figure 2D:
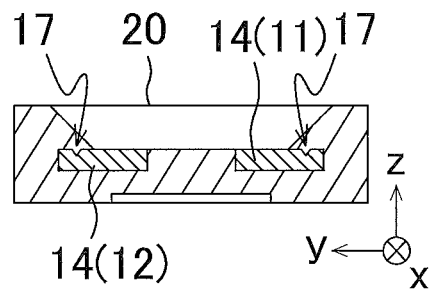
FIG. 2D is an enlarged abbreviated cross-section view through line C-C in FIG. 2A.

FIG. 1A is an abbreviated top view showing a light emitting device for the first embodiment, and FIG. 1B is an abbreviated cross-section view showing the cross-section through line A-A in FIG. 1A. FIGS. 2A and 2B are abbreviated top and bottom views of a light emitting device package for the first embodiment. FIGS. 2C and 2D are enlarged abbreviated cross-section views showing cross-sections through the lines B-B and C-C of FIG. 2A respectively. Note for convenience, FIGS. 1 and 2 are drawn to different scales.

As shown in FIGS. 1A and 1B, the light emitting device 200 for the first embodiment is primarily configured with light emitting elements 30 mounted in the light emitting device package 100 shown in FIGS. 2A-2D and enclosed by encapsulating material 60. Although the encapsulating material 60 of the present example includes fluorescent material 70, the fluorescent material 70 can be omitted.

As shown in FIGS. 1A, 1B and 2A-2D, the package 100 as viewed from above has a shape with a long dimension in one direction. Namely, when viewed from above, the package 100 has a lengthwise direction and a shorter lateral direction perpendicular to the lengthwise direction. More specifically, the lengthwise direction is the direction parallel to the lead-frame package sides (which are the ends of the package in the lateral direction) that extend in the long direction as viewed from above. In FIGS. 1A, 1B and 2A-2D, the lengthwise direction of the package is the x-direction, the lateral direction is the y-direction and the up and down (vertical) direction is the z-direction. Accordingly, the x-direction is the length direction, the y-direction is the width direction, and the z-direction is the thickness direction.

The package 100 shown in FIGS. 2A-2D is provided with two lead-frames 11, 12, and molded resin 20 formed as a single unit with the two lead-frames. The two lead-frames 11, 12 are lined-up in the lengthwise direction of the package 100. Each of the lead-frames 11, 12 is shaped with a long (lengthwise) direction in a manner similar to the package 100. The gap region 13 that separates the two lead-frames 11, 12 is embedded in the molded resin 20 and is maintained by the single unit structure of the molded resin 20 as an electrical isolation region. Note that the light emitting elements are mounted on the upper surface of the package 100. In FIGS. 1A, 1B and 2A-2D, the lead-frame on the left side is called the first lead-frame 11 and the lead-frame on the right side is called the second lead-frame 12.

Although the maximum width (the maximum dimension in the lateral direction, for example, the width of the main part of the lead-frame where the width is approximately constant) of the two lead-frames 11, 12 can be different, it is preferable for the maximum widths to be approximately the same. Although the two lead-frames 11, 12 can be oriented at an angle with respect to each other (as viewed from above), it is preferable for the lead-frames to be disposed approximately parallel to each other. Further, although the lead-frames 11, 12 can be disposed with their lengthwise centerlines shifted in the lateral direction (as viewed from above), it is preferable for the lead-frames to be disposed with their lengthwise centerlines aligned (in a single line).

The molded resin 20 has a rectangular shape (as viewed from above) that extends in the lengthwise direction of the package. The molded resin 20 covers part (or all) of both sides (lateral surfaces) of the lead-frames 11, 12. The molded resin 20 covers part (in particular, periphery regions) of the upper surfaces of the lead-frames 11, 12. Further, the molded resin 20 and the lead-frames 11, 12 form a cavity to hold the light emitting elements. Specifically, the bottom of the cavity is formed by the upper surfaces of the lead-frames 11, 12 and the upper surface of the molded resin 20 filling the gap region 13. Although the bottom surface of the cavity is planar in the present example, it can also be provided, for example, with protrusion at the top of the gap region 13. This protrusion is preferably tapered to become wider at the bottom of the cavity for efficient extraction of light emitted by the light emitting elements. The protrusion can be formed in a single-piece configuration with the molded resin 20 or it can be formed separately from the molded resin 20. The side-walls of the cavity are formed by surfaces of the molded resin 20. Although the cavity side-walls can be vertical, tapered side-walls that reduce the size of the cavity opening towards the bottom of the cavity are preferable for efficiently extracting light emitted by the light emitting elements.

Each of the two lead-frames 11, 12 has an extension 14 that narrows as it extends towards the opposite lead-frame. When viewed from above, at least parts of the two extensions 14 are positioned opposite each other in the lateral direction. Each of the two lead-frames 11, 12 has a first thin region 15 that is thinned by establishing a recess in the lower surface of the lead-frame, and that recess is covered with molded resin 20. In particular, for the present example, the first thin regions 15 are established at the ends of the lead-frames 11, 12 that face each other, and in a continuous manner from one side to the other in the lateral direction. Specifically, the recesses that form the first thin regions 15 for the present example extend to the opposing ends of the two lead-frames 15 and to both sides in the lateral direction. Further, the extensions 14 are entirely within first thin regions 15. Note that the recesses that form the first thin regions 15 can be established in the lower surfaces and/or the upper surfaces of the lead-frames 11, 12. Further, parts of the extensions 14 of the two lead-frames 11, 12 that oppose each other in the lateral direction (as viewed from above) can also be positioned at different vertical heights (in the z-direction of FIGS. 1A, 1B and 2A-2D).

Here, a "thin region" is a region where the lead-frame 11, 12 thickness is partially thinned. For example, if a lead-frame is thinned by establishing a recess in its lower surface, a step is formed on the lower surface between the thin region and the un-thinned thick region. Thin regions, recesses, cavities, grooves and through-holes can be formed in lead-frame 11, 12 sheet material by processing techniques such as pressing, rolling, or etching.

Since the extensions 14 of each lead-frame 11, 12 are positioned opposite each other in the lateral direction of the package 100 described above, the gap region 13 between the two lead-frames 11, 12 is not established simply in a straight-line parallel to the lateral direction. For example, the gap region 13 can have a shape that includes bends. Accordingly, package strength with respect to stress applied near the gap region can be increased compared to a package with a gap region shaped simply as a straight-line parallel to the lateral direction. For example, this package has increased robustness with respect to force applied to bend the package at the gap region. Further, by establishing the extensions 14 entirely within the first thin regions 15, the extensions 14 are supported by the molded resin 20 formed to continuously cover the first thin regions 15 of both lead-frames. This allows further increase in package robustness.

Recesses that form the first thin regions 15 in the two lead-frames 11, 12 are preferably established only on lead-frame lower surfaces (as in the present example). This allows essentially the entire lower surfaces of the extensions 14 to be covered with molded resin 20, and since the molded resin 20, which is formed continuously over the first thin regions 15 of both lead-frames 11, 12, supports the extensions 14 from their lower surfaces, package strength increase is straightforward. Further, this allows suppression of any separation of the two lead-frames 11, 12 from the bottom of the molded resin 20. Here, (metal) rolling first thin regions 15 in the lead-frames 11, 12 as "multigage strips" can establish high-precision easily-thinned surfaces, and that processing method is preferable.

Since the extension 14 of one lead-frame extends into the lengthwise bounds of the other lead-frame, connection points for light emitting element 30 and protection device 80 wires 50 can be established on the upper surfaces of the extensions 14, and the wires 50 can be made relatively short. This alleviates any light reduction due to intervening wires 50 and improves the light extraction efficiency.

The following describes a preferable embodiment of the light emitting device package 100 and light emitting device 200.

The gap region 13 between the two lead-frames in the package 100 shown in FIGS. 2A-2D is established (with its centerline) parallel to the lateral direction at both lateral edge regions. Accordingly, at the lateral edge regions of the gap region 13, opposing ends of the two lead-frames 11, 12 are approximately parallel to the lateral direction. This makes it easy to reduce the width of the gap region 13 in the lateral edge regions to make the package more robust. In particular, it is desirable for the width of the gap region 13 to be approximately uniform over its entire span. Further, the two lead-frames 11, 12 in the package 100 shown in FIGS. 2A-2D have extensions 14 that gradually narrow as they extend in length. Consequently, part of the ends of the two lead-frame 11, 12 extensions 14 that face each other are at an angle with respect to the lateral direction. Specifically, the two extensions 14 are oriented opposite each other in both the lateral direction and the lengthwise direction of the package. This makes it easy to establish a small gap region 13 and lengthen the extensions 14 in a small area. The closer that parts of the opposing ends of the two lead-frame 11, 12 extensions 14 become to parallel with the lengthwise direction, the stronger the package with respect to stress applied near the gap region.

The extensions 14 of the two lead-frames 11, 12 in the package shown in FIGS. 2A-2D are established approximately in the center of the package. Positioning the extensions 14 approximately in the center of the package simplifies mounting of the light emitting elements on the two lead-frames 11, 12 and affords desirable light distribution characteristics. However, since both of the lead-frames 11, 12 extend in the lengthwise direction approximately the same distance from the center gap region 13, it is easy for stress to be induced at the gap region 13. The structure of the present embodiment increases package strength in that center region.

In the package 100 shown in FIGS. 2A-2D, the two lead-frames 11, 12 have recesses in their lower surfaces that establish second thin regions 16 separated from the first thin regions 15 along the lateral edges of the lead-frames. The recesses that form the second thin regions 16 are covered by molded resin 20. Thick (un-thinned) regions are formed on the lower surfaces of the lead-frames 11, 12 between the first thin regions 15 and the second thin regions 16. Steps are formed between the thick regions and the second thin regions 16, and when the recesses forming the second thin regions 16 are covered with molded resin 20; those steps act as gripping elements that suppress lead-frame 11, 12 separate from the molded resin 20 in the lengthwise direction. This structure also suppresses separation of the lead-frames 11, 12 from the molded resin 20 in the downward direction. The recesses that form the second thin regions 16 on the lower surfaces of the lead-frames 11, 12 extend to the lateral edges of the lead-frames. Although the second thin regions 16 can be shaped as points or broken lines (as viewed from above), straight-line shapes extending in the lengthwise direction are preferable because they can be effectively formed with a small size in relatively small areas. The cross-sectional shape of each second thin region 16 is easily formed in a rectangular shape, which is the preferable shape. Further, the second thin regions 16 can be formed easily with good results by press processing.

In the package 100 shown in FIGS. 2A-2D, first thin regions 15 are formed thinner than second thin regions 16. By forming thinner first thin regions 15, molded resin 20 that covers the recesses that form the first thin regions 15 can be made thicker. This can strengthen the package with respect to stress near the gap region 13 and can further suppress downward direction separation of the lead-frames 11, 12 from the molded resin 20. Lead-frame 11, 12 separation suppression effects of molded resin 20 covering the recesses that form the second thin regions 16 are secondary compared to those of the molded resin 20 in the first thin regions 15. Further, thicker second thin regions 16 can be established by shallower recesses, which are preferable because they can be formed by processing that produces little burring on the edges.

In the package 100 shown in FIGS. 2A-2D, the two lead-frames 11, 12 have grooves 17 established in the upper surfaces of the extensions 14. The grooves 17 are embedded in molded resin 20. This improves the adhesion of molded resin 20 to the extensions 14, and allows molded resin 20 delamination from the lead-frames 11, 12 to be suppressed. Although the grooves 17 can be shaped as points or broken lines (as viewed from above), straight-line shapes extending in the lengthwise direction are preferable because they can be effectively formed with a small size in relatively small areas. Although the cross-sectional shape of each groove 17 can be semi-circular, rectangular, or trapezoidal (with the wide base at the top), a v-shape is easy to form and preferable. Further, as shown in the present example, the grooves 17 can be formed to extend continuously beyond the extensions 14 over the upper surfaces of the first thin regions 15 and second thin regions 16.

In the package 100 shown in FIGS. 2A-2D, each of the two lead-frames 11, 12 has a through-hole 18 established at the lengthwise end opposite from the extension 14. The through-holes 18 are embedded in molded resin 20. This allows molded resin 20 formed on the inside surfaces of the through-holes 18 to act as gripping elements that hold the lead-frames 11, 12 in position and suppress lead-frame separation from the molded resin 20 in the lengthwise direction. Although the through-holes 18 can extend beyond the ends of the lead-frames 11, 12 (forming cut-outs instead of through-holes), it is preferable to separate the through-holes 18 from the lead-frame edges at the ends of the package in the lengthwise direction (as in the present example). This establishes position-locking molded resin 20 against inside surfaces of the through-holes 18 in every direction (as viewed from above), and makes it easier to suppress lead-frame 11, 12 separation from the molded resin 20. The shape of the through-holes 18 viewed from above can be rectangular (corners can be rounded) or circular. The through-holes 18 can be used as entry points to introduce molding material when the molded resin 20 is formed.

In the package 100 shown in FIGS. 2A-2D, the lengthwise ends of the lead-frames 11, 12 extend outside the molded resin 20. This enables package 100 and light emitting device 200 surface mounting characteristics such as soldering characteristics to be improved. Further, each lead-frame 11, 12 end region that extends outside the molded resin 20 has a cut-out central area that divides it into two protruding regions. This allows further improvement in the surface mounting characteristics such as soldering characteristics. Here, the outside corners of the lead-frames 11, 12 extending outside the molded resin 20 are truncated. This reduces damage to other packages and/or light emitting devices when many packages or light emitting devices are put in a bag for handling, transport, and storage.

In the package 100 shown in FIGS. 2A-2D, the lowest surfaces of the two lead-frames 11, 12 along with the lowest surface of the molded resin 20 form the bottom surface of the package 100. This makes the lowest surfaces of the two lead-frames 11, 12 surface mounting areas of the package 100, and enables efficient heat dissipation from the lead-frames 11, 12. This allows molded resin 20 thermal degradation and lead-frame delamination to be controlled, and improves heat transfer away from the light emitting elements 30 and protection device 80.

In the light emitting device 200 shown in FIGS. 1A and 1B, light emitting elements 30 are attached to each of the upper surfaces of the first lead-frame 11 and the second lead-frame 12 in the package 100 with mounting adhesive 40 (die-attach). The light emitting element 30 attached to the first lead-frame 11 is connected to the upper surface of the extension 14 of the second lead-frame 12 by a wire 50. The light emitting element 30 attached to the second lead-frame 12 is connected to the upper surface of the extension 14 of the first lead-frame 11 by a wire 50.

Accordingly, the light emitting device 200 is provided with a package 100, and a light emitting element 30 attached to the upper surface of at least one of the two lead-frames 11, 12. This allows a highly reliable package to be used to make a highly reliable light emitting device. Further, it is desirable to connect the light emitting element 30 mounted on one of the two lead-frames 11, 12 to the upper surface of the extension 14 of the opposite lead-frame with a wire 50. Because the extension 14 of one lead-frame extends into the lengthwise bounds of the other lead-frame, a wire 50 connected to the opposite lead-frame can be made relatively short. This can alleviate light reduction due to the wire 50 and allows increased light extraction efficiency.

In the light emitting device 200 shown in FIGS. 1A and 1B, light emitting elements 30 are mounted on each of the two lead-frames 11, 12. By mounting light emitting elements 30 on each of the two lead-frames 11, 12, the distance between the two light emitting elements 30 can be easily increased making it easy to control the luminance distribution. Further, since the extension 14 of one lead-frame extends into the lengthwise bounds of the other lead-frame, wires 50 connected to opposite lead-frames of the package 100 can be made relatively short even when light emitting elements 30 are mounted on both lead-frames. This alleviates any light reduction due to intervening wires 50 and makes it easy to improve the light extraction efficiency.

In the light emitting device 200 shown in FIGS. 1A and 1B, a protection device 80 is mounted via conducting adhesive on the upper surface of the extension 14 of the second lead-frame 12 positioned approximately in the center of the package 100. The protection device 80 is also connected to the upper surface of the extension 14 of the first lead-frame 11 via a wire 50.

In this type of light emitting device 200 with extensions 14 positioned approximately in the center of the package 100, a protection device 80 is preferably mounted on the upper surface of the extension 14 of either one of the two lead-frames 11, 12. This makes it easy to increase the distance between the protection device 80 and the light emitting elements 30, alleviates light reduction due to the protection device 80, and makes it easy to improve the light extraction efficiency. It is also desirable to connect the protection device 80 mounted on one of the two lead-frames 11, 12 to the upper surface of the extension 14 of the opposite lead-frame via a wire 50. Since this allows the wire 50 connecting the protection device 80 and the opposite lead-frame to be made relatively short, light reduction due to the wire 50 can be alleviated, and light extraction efficiency can be easily further improved.

In the light emitting device 200 shown in FIGS. 1A and 1B, the two second thin regions 16 in each lead-frame 11, 12 are established extending in the lengthwise direction on both sides of the light emitting element 30. By establishing the two second thin regions 16 in this manner extending lengthwise on both sides of the light emitting element 30, delamination of molded resin 20 near the light emitting element 30 can be suppressed allowing the side-walls of the molded resin 20 cavity to function stably as light-reflecting surfaces. Further, the lower surfaces of lead-frames 11, 12 that are positioned directly under the light emitting elements 30 are exposed outside the bottom of the molded resin 20. This allows the exposed lead-frame regions to act as surface mounting areas of the light emitting device 200 and makes it easy to improve heat transfer from the light emitting elements 30.

The following describes each structural element of the light emitting device package and light emitting device of the present embodiment.

(Lead-Frames 11, 12)

Metal materials that can conduct electricity and can be connected with the light emitting elements and protection device can be used as the lead-frames. Specifically, metals such as copper, aluminum, gold, silver, tungsten, iron (steel), nickel, cobalt, molybdenum, alloys of those metals including copper-iron alloy, and phosphor bronze can be used when processed in sheet metal form by various methods. In addition, metal plating or light reflecting thin-film can be established on the lead-frame surface with materials such as silver, aluminum, rhodium, gold, copper, and alloys of those metals. Among those materials, silver, which has the best light reflecting characteristics, is preferable.

(Molded Resin 20)

The base material (matrix) of the molded resin can be a thermoplastic resin such as aliphatic polyamide resin, semi-aromatic polyamide resin, polyethylene terephthalate, polycyclohexane terephthalate, liquid crystal polymer, polycarbonate resin, syndiotactic polystyrene, polyphenylene-ether, polyphenylene-sulfide, polyether-sulfone resin, or polyetherketone resin. Or, the base material can be a thermosetting resin such as polybismaleimide-triazine resin, epoxy resin, silicone resin, denatured silicone resin, silicone-based resin, polyimide resin, or polyurethane resin. In addition, particulate or fiber fillers and pigments such as glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, calcium titanate, aluminum borate, aluminum oxide, silicon carbide, antimony oxide, zinc stannate, zinc borate, iron oxide, chrome oxide, manganese oxide, and carbon black can be mixed into the base material.

(Light Emitting Elements 30)

Light emitting semiconductor devices such as light emitting diodes and semiconductor laser diodes can be used as the light emitting elements. The light emitting element can be any of a variety of semiconductor structures configured with a pair of positive and negative electrodes. In particular, nitride semiconductor light emitting elements (e.g. $In_xAl_yGa_{1-x-y}N$, $0 \le x$, $0 \le y$, $x+y \le 1$) that can efficiently excite fluorescent material are preferable. In addition, gallium arsenide based and gallium phosphide based semiconductors that emit light from green to red wavelengths can be the light emitting elements. For light emitting elements with the positive and negative electrodes established on the same side of the chip, the chip is mounted with the electrode surface up and with wires connecting each electrode to a lead-frame. For light emitting elements with an opposing electrode structure having electrodes established on the top and bottom surfaces of the chip, the bottom side electrode is connected to a lead-frame via conducting adhesive (die-attach) and the upper surface electrode is connected to a lead-frame via a wire. This is the same as the mounting configuration of the protection device described later. Further, by establishing a metal layer such as silver or aluminum, or a light-reflecting dielectric layer on the die-attachment surface side of the light emitting element, light extracting efficiency can be improved. A single light emitting element or a plurality of light emitting elements can be mounted in a single light emitting device package, and the size, shape, and light emission wavelength of the light emitting elements can be selected freely. A plurality of light emitting elements can be connected in series or parallel via the lead-frames/wires. Further, a combination of light emitting elements such as one blue light emitting element and one red light emitting element (two element), one blue light emitting element and one green light emitting element (two element), or one blue light emitting element, one green light emitting element, and one red light emitting element (three element) combination can also be mounted in a single light emitting device package. When three light emitting elements are mounted, a light emitting element can be mounted, for example, in the position of the protection device shown in FIGS. 1A and 1B.

(Mounting Adhesive 40, 45)

The mounting adhesive (die-attach) is material for attaching the light emitting elements and protection device to the lead-frames. Epoxy resin, silicone resin, polyimide resin, or modified (denatured) or hybrid resin derived from those resins can be used as insulating (non-conducting) mounting adhesive. Conducting paste (adhesive) that includes material such as silver, gold, and palladium, or solders and low melting-point metals such as gold-tin brazing material can be used as conducting mounting adhesive.

(Wires 50)

The wires are conducting wires that connect light emitting element and protection device electrodes with the lead-frames. Specifically, metal wire including gold, copper, silver, platinum, aluminum, and alloys of those metals can be used. In particular, gold wire, which can withstand stress applied by the encapsulating material without breaking and is superior with respect to characteristics such as thermal resistance, is preferable. Further, to improve light reflection characteristics, the wires can be configured with silver at least on the surface.

(Encapsulating Material 60)

The encapsulating material is material that encapsulates the light emitting elements, protection device, and wires and protects them from dust (particulates), moisture, and external forces. The base material of the encapsulating material can be material that is electrically insulating and can transmit light emitted by the light emitting elements (preferably with a light transmissivity greater than or equal to 70%). Specifically, silicone resin, epoxy resin, phenol resin, polycarbonate resin, acrylic resin, polymethyl-pentene resin (Mitsui Chemical brand name: TPX resin), polynorbornene resin, modified (denatured) resin derived from those resins, or hybrid resin including one or more of those resins can be used. Glass can also be used. Of those materials, silicone resin has superior ability to withstand to heat and light, shows little post-hardening volume reduction, and is preferable. The encapsulating material can also have particles with various functions such as filler and fluorescent material added into the base material. Filler can be material such as light dispersing agents or coloring pigments. Specifically, filler can be silica, titanium oxide, magnesium oxide, magnesium carbonate, magnesium hydroxide, calcium carbonate, calcium hydroxide, calcium silicate, zinc oxide, barium titanate, aluminum oxide, iron oxide, chrome oxide, manganese oxide, glass, and carbon black. Further, the encapsulating material can include hollow regions or can be porous.

(Fluorescent Material 70)

The fluorescent material absorbs at least part of the (primary beam of) light emitted from the light emitting element and re-emits (secondary) light at a wavelength different from that of the primary beam. Specifically, the fluorescent material can be substances such as cerium activated yttrium-aluminum-garnet (YAG:Ce), europium and/or chrome activated nitrogen-containing calcium aluminosilicate ($CaO—Al_2O_3—SiO_2$), or europium activated silicates ($[Sr,Ba]_2SiO_4$). This allows realization of a light emitting device that outputs a combination of visible wavelength primary light mixed with secondary emitted colors (e.g. white light output), or a light emitting device with fluorescent material excited by ultraviolet primary light that outputs secondary light at visible wavelengths. Here, the fluorescent material can be settled towards the bottom of the package cavity or dispersed throughout the cavity.

(Protection Device 80)

The protection device is a device to protect the light emitting elements from static (electricity) discharge and high-voltage surge. Specifically, the protection device can be a Zener diode. To suppress protection device light absorption, it can be covered with reflective material such as white resin.

EXAMPLES

The following is a detailed description of examples of the present embodiment. However, it should go without saying that the present invention is not limited only to the examples below.

First Example

The light emitting device of the first example has the structure of the example shown in FIGS. 1A and 1B, and is a surface-mount (device) light emitting diode (SMD LED) as a top view type.

The package 100 is configured with two lead-frames 11, 12 that make up the positive and negative electrodes and is formed as a single-piece with molded resin 20 having overall package dimensions of 7.0 mm in length, 2.0 mm in width, and 0.65 mm in thickness. Packages 100 are fabricated by loading a pre-processed sheet-metal plate, which has a plurality of lead-frame 11, 12 pairs arrayed in two-dimensions, inside a mold cavity. Material that forms the molded resin 20 is introduced into the mold cavity in liquid form and hardened. After removal from the mold, each package is separated from the rest (singulated).

Each of the two lead-frames 11, 12 is a small piece of copper alloy sheet-metal with a silver plated surface with a width of 1.5 mm and thickness of 3.0 mm (maximum). The ends of the two lead-frames 11, 12 that face each other have approximately right angle corners on both sides. Further, the gap region 13 between the lead-frames 11, 12 is established with an approximately uniform width of 0.3 mm and with a shape that has two bends (as viewed from above). Specifically, the gap region 13 is established approximately parallel to the lateral direction at both of the (lateral) sides, and at an oblique angle with respect to the lateral direction (as viewed from above) in the mid-region. Accordingly, the parts of the lead-frames that include oblique edges are the extensions 14. The first thin regions 15 are regions processed by metal rolling the lower surfaces of the opposing ends of the two lead-frames 11, 12 straddling the center of the gap region 13 (package center) with a width of 1.43 mm and thickness of 0.12 mm. The gap region 13 is stamped-out with a metal press. The extensions 14 are entirely inside first thin regions 15 (approximately 0.2 mm inside the edges of the first thin regions 15). Cavities that form the second thin regions 16 are established in the lower surface of each lead-frame 11, 12 approximately 0.13 mm from the first thin region 15 in rectangular shapes extending to the lateral edges with a length of 1.35 mm, width of 0.15 mm, and depth of 0.1 mm. The second thin regions 16 are formed by (sheet-metal) press processing. Further, the upper surface of each lead-frame 11, 12 has v-shaped grooves 17 extending in the lengthwise direction with center-lines 0.1 mm inward from the lateral edges with a width of 0.05 mm and a depth of 0.01 mm to 0.04 mm, and those grooves 17 are embedded in the molded resin 20. In addition, each lead-frame 11, 12 is provided with a through-hole 18 near, but separated from the lengthwise end of the lead-frame that faces outward (not towards the other lead-frame) in a rectangular shape with rounded corners (as viewed from above) with a length of 0.7 mm and width of 1.0 mm, and each through-hole 18 is embedded in the molded resin 20. The through-hole 18 in one of the lead-frames is used as the entry gate to introduce molded resin 20 material, and a "gate-mark" with protruding ridges is formed on the lower surface of the molded resin 20 inside that through-hole 18. A laterally extending groove with the same v-shape as the lengthwise extending grooves 17 is established adjacent each through-hole 18, and the lateral extending groove is also embedded in the molded resin 20. Further, each of the outward facing ends of the two lead-frames 11, 12 extends outside the molded resin 20 in the lengthwise direction, each protruding end divides into two projecting branches, and each protruding end functions as a terminal for external connection.

The molded resin 20 is aliphatic polyamide resin that includes titanium oxide molded into a rectangular shape (as viewed from above) with a length of 6.2 mm and width of 2.0 mm. A cavity having a rectangular shape with semicircles at both ends (race-track shape) is formed approximately in the center of the upper surface of the molded resin 20 with a length of 6.0 mm, width of 1.6 mm, and depth of 0.35 mm. The bottom of the cavity has the same race-track shape with a length of 4.2 mm and width of 1.1 mm. Accordingly, the side-walls are inclined with respect to the exposed bottom of the cavity at an angle of 158.7° at the lengthwise ends and 125.5° along the lateral sides.

Two light emitting elements 30 are mounted with silicone resin mounting adhesive 40 (die-attach) on the upper surfaces of the two lead-frames 11, 12 that form the bottom of the cavity in the package 100. Each light emitting element 30 is a nitride semiconductor light emitting diode (LED) chip with an n-type layer, an active layer, and a p-type layer formed in that order on a sapphire substrate. The LED chip can output blue light (with a center wavelength of 460 nm) and has dimensions 650 µm by 650 µm by 150 µm. The distance between the centers of the two light emitting element 30 die is 2.5 mm. One of the (p or n) electrodes is connected via a wire 50 to the lead-frame that the chip is mounted on, and the other (p or n) electrode is connected via a wire 50 to the extension 14 of the opposite lead-frame. This connects the two light emitting elements 30 in parallel. The wires are 25 µm diameter gold (bonding) wire.

Further, a Zener diode protection device 80 configured with opposing electrodes on the top and bottom surfaces of the die is mounted with silver mounting adhesive 45 (conducting die-attach) on the upper surface of the extension 14 of one of the lead-frames. The upper surface electrode of the protection device 80 is connected to the extension 14 of the other lead-frame via a wire 50.

The package 100 cavity with the two light emitting elements 30 and protection device 80 mounted inside is filled with encapsulating material 60 that encloses all the die. The encapsulating material 80 is silicone base material that includes YAG:Ce fluorescent material and silica filler. The upper surface of the encapsulating material 60 is approximately in the same plane as the upper surface of the molded resin 20 making an essentially planar upper surface. The encapsulating material 60 is dispensed into the package 100 cavity in a fluid state and solidified by heating.

The light emitting device 200 configured as described above for the first example has a forward bias current of 260 mA with a forward bias voltage of 3.15V, and can emit light with a luminous flux of 86.6 lumen and chromaticity coordinates of x=0.259, y=0.223.

<Evaluation>

Characteristics such as package 100 strength were evaluated for the light emitting device 200 of the first example. Light emitting devices were surface mounted on 1.6 mm thick glass epoxy circuit boards (flame retardant type 4 [FR-4]) and the boards were pressed inward from the back surface for 5 sec intervals in a circuit board bending test. No package cracking resulted before the pressing depth exceeded 5 mm. Flexing strength testing resulted in package damage at 16.5N. Further, ink penetration testing showed no ink penetration into the package cavity implying that close adhesion was achieved between the lead-frames 11, 12 and the molded resin 20.

The light emitting device package can be used with good results as a surface mount device (SMD) light emitting diode (LED) package. A light emitting device using the package can be used in applications such as liquid crystal display backlighting, various illumination and lighting equipment, large-scale displays, and various display apparatus such as signs for advertisement and destination direction. The light emitting device can also be used in equipment such as digital video cameras, copy machines, image processing equipment such as scanners, and projectors. It should be apparent to those with an ordinary skill in the art that while various preferred examples have been shown and described, it is contemplated that the embodiment is not limited to the particular examples disclosed, which are deemed to be merely illustrative of the inventive concepts and should not be interpreted as limiting the scope of the embodiment, and which are suitable for all modifications and changes falling within the spirit and scope of the embodiment as defined in the appended claims. The present application is based on Application No. 2012-241155 filed in Japan on Oct. 31, 2012, the content of which is incorporated herein by reference.

What is claimed is:

1. A light emitting device having a lengthwise direction in a top view and a lateral or widthwise direction perpendicular to the lengthwise direction comprising:
   two lead-frames aligned in the lengthwise direction,
   at least one light emitting element mounted on an upper surface of at least one of the two lead lead-frames, and
   molded resin formed as a single unit with the two lead-frames,
   wherein each of the two lead-frames has a first thin region that forms a recess in the lower surface of each of the two lead-frames, and the recess is covered with the molded resin, and
   wherein each lead-frame has an extension that narrows as it extends towards the opposite lead-frame, each extension being entirely within first thin regions, and in a top view, at least parts of the opposing extension is positioned opposite each other in the lateral direction, and
   wherein a wire that connects the light emitting element mounted on one of the two lead-frames is connected with an upper surface of the extension of the opposite lead-frame.

2. The light emitting device as recited in claim 1 wherein the centerline of a gap region between the two lead-frames is provided approximately parallel to the lateral direction near the lateral edges in a top view.

3. The light emitting device as recited in claim 1 wherein each of the two lead-frames has a groove provided on the upper surface of the each extension, and each groove is embedded in the molded resin.

4. The light emitting device as recited in claim 1 wherein each extension is positioned approximately in the center of the molded resin.

5. The light emitting device as recited in claim 1 wherein each of the two lead-frames has second thin regions that are separated from the first thin regions and thinned in a thickness direction of the each of the two lead-frames by recesses provided in lateral edge regions of the lower surface of the each of the two lead-frames, and the recesses are covered with the molded resin.

6. The light emitting device as recited in claim 1 wherein each of the two lead-frames has a through-hole provided near the opposite end of each lead-frame from each extension in the lengthwise direction, and the through-hole is embedded in the molded resin.

7. The light emitting device as recited in claim 1 wherein the lowest surfaces of the two lead-frames along with the lowest surface of the molded resin form a bottom surface.

8. The light emitting device as recited in claim 1 wherein one light emitting element is mounted on each of the two lead-frames.

9. The light emitting device as recited in claim 8
   wherein the extensions are positioned approximately in the center of the molded resin; and
   further comprising a protection device mounted on the upper surface of either one of the two lead-frame extensions.

10. The light emitting device as recited in claim 1 wherein the molded resin and the two lead-frames form a cavity that is filled with encapsulating material in an area above a gap region, the gap region being disposed between the two lead-frames and embedded in the molded resin.

11. The light emitting device as recited in claim 9 wherein the centerline of a gap region between the two lead-frames is provided approximately parallel to the lateral direction near the lateral edges as viewed from in a top view.

12. The light emitting device as recited in claim 11 wherein each of the two lead-frames has a groove provided on the upper surface of each extension, the grooves being embedded in the molded resin.

13. The light emitting device as recited in claim 12 wherein each of the two lead-frames has second thin regions that are separated from the first thin regions and thinned in a thickness direction of each of the two lead-frames by recesses provided in lateral edge regions of the lower surface of the each of the two lead-frames, and the recesses are covered with the molded resin.

14. The light emitting device as recited in claim 13 wherein each of the two lead-frames has a through-hole provided near the opposite end of each lead-frame from each extension in the lengthwise direction, and the through-hole is embedded in the molded resin.

15. The light emitting device as recited in claim 14 wherein the lowest surfaces of the two lead-frames along with the lowest surface of the molded resin from a bottom surface.

* * * * *